United States Patent
Bellini et al.

(10) Patent No.: US 12,230,675 B2
(45) Date of Patent: Feb. 18, 2025

(54) PLANAR SIC MOSFET WITH RETROGRADE IMPLANTED CHANNEL

(71) Applicant: Hitachi Energy Ltd, Zürich (CH)

(72) Inventors: Marco Bellini, Schlieren (CH); Lars Knoll, Hägglingen (CH)

(73) Assignee: Hitachi Energy Ltd, Zürich (CH)

( * ) Notice: Subject to any disclaimer, the term of this patent is extended or adjusted under 35 U.S.C. 154(b) by 291 days.

(21) Appl. No.: 17/631,711

(22) PCT Filed: Jul. 31, 2020

(86) PCT No.: PCT/EP2020/071698
§ 371 (c)(1),
(2) Date: Jan. 31, 2022

(87) PCT Pub. No.: WO2021/019086
PCT Pub. Date: Feb. 4, 2021

(65) Prior Publication Data
US 2022/0320290 A1    Oct. 6, 2022

(30) Foreign Application Priority Data
Aug. 1, 2019  (EP) .................................... 19189649

(51) Int. Cl.
*H01L 29/10* (2006.01)
*H01L 21/04* (2006.01)
(Continued)

(52) U.S. Cl.
CPC ........ *H01L 29/1045* (2013.01); *H01L 21/046* (2013.01); *H01L 29/1608* (2013.01);
(Continued)

(58) Field of Classification Search
None
See application file for complete search history.

(56) References Cited

U.S. PATENT DOCUMENTS 6,255,174 B1    7/2001  Yu
9,922,977 B2    3/2018  Arghavani et al.
(Continued)

FOREIGN PATENT DOCUMENTS

CN    101310388 A    11/2008
CN    102484126 A    5/2012
(Continued)

OTHER PUBLICATIONS

Wilson, Robert G., "The Pearson IV Distribution and its Application to Ion Implanted Depth Profiles", Radiation Effects, vol. 46, Gordon and Breach Science Publishers, Inc., 1980, pp. 141-147.

*Primary Examiner* — Jack S Chen
(74) *Attorney, Agent, or Firm* — Slater Matsil, LLP

(57) ABSTRACT

A silicon carbide (SiC) planar transistor device includes a SiC semiconductor substrate of a first charge type, a SiC epitaxial layer of the first charge type formed at a top surface of the SiC semiconductor substrate, a source structure of the first charge type formed at a top surface of the SiC epitaxial layer, a drain structure of the first charge type formed at a bottom surface of the SiC semiconductor substrate, a gate structure comprising a gate runner and a gate dielectric that covers at least part of the source structure and the gate runner, and a channel region of a second charge type located in vertical direction below the gate structure and adjacent to the source structure. The channel can be formed by performing a plurality of implantation steps so that the channel region comprises a first region and a second region.

13 Claims, 3 Drawing Sheets

(51) Int. Cl.
*H01L 29/16* (2006.01)
*H01L 29/66* (2006.01)
*H01L 29/739* (2006.01)
*H01L 29/78* (2006.01)

(52) U.S. Cl.
CPC .... *H01L 29/66068* (2013.01); *H01L 29/7395* (2013.01); *H01L 29/7802* (2013.01)

(56) References Cited

U.S. PATENT DOCUMENTS

| | | |
|---|---|---|
| 2006/0001126 A1 | 1/2006 | Mouli |
| 2009/0173997 A1 | 7/2009 | Fujihira et al. |
| 2012/0097980 A1 | 4/2012 | Masuda et al. |
| 2022/0320290 A1* | 10/2022 | Bellini .................... H01L 29/36 |

FOREIGN PATENT DOCUMENTS

| | | |
|---|---|---|
| JP | 2009054765 A | 3/2009 |
| JP | 2009130252 A | 6/2009 |
| JP | 2011171374 A | 9/2011 |
| JP | 2015226030 A | 12/2015 |
| WO | 2007046254 A1 | 4/2007 |

* cited by examiner

PLANAR SIC MOSFET WITH RETROGRADE IMPLANTED CHANNEL

CROSS-REFERENCE TO RELATED APPLICATIONS

This application is a national stage application of International Application No. PCT/EP2020/071698, filed on Jul. 31, 2020, which claims priority to European Patent Application No. 19189649.7, filed on Aug. 1, 2019, which applications are hereby incorporated herein by reference.

TECHNICAL FIELD

The present disclosure relates to a Silicon carbide (SiC) planar transistor device.

BACKGROUND

This section provides background information related to the present disclosure which is not necessarily prior art.

U.S. Pat. No. 9,922,977 B2 discloses a structure and method of fabrication thereof relate to a Deeply Depleted Channel (DDC) design, allowing CMOS based devices to have a reduced $_o V_T$ (variation in $V_T$) compared to conventional bulk CMOS and can allow the threshold voltage $V_T$ of FETs having dopants in the channel region to be set much more precisely. A dopant profile indicative of a distinctive notch enables tuning of the $V_T$ setting within a precise range. This $V_T$ set range may be extended by appropriate select ion of metals of a gate electrode material so that a very wide range of $V_T$ settings is accommodated on the die. The DDC design also can have a strong body effect compared to conventional bulk CMOS transistors, which can allow for significant dynamic control of power consumption in DDC transistors. The result is the ability to independently control $V_T$ (with a low $_o V_T$) and VDD (the operating voltage supplied to the transistor), so that the body bias can be tuned separately from $V_T$ for a given device.

U.S. Pat. No. 6,255,174 B1 discloses improved semiconductor devices, such as MOSFET's with a delayed threshold voltage roll-off and short channel effects, making the semiconductor devices more tolerant of gate variations for short gate length devices. The semiconductor device comprises an asymmetric channel doping profile. A first pocket dopant implantation with a 0° tilt is used to create a first source dopant pocket and a drain dopant pocket. A second pocket dopant implantation with a 30-60° tilt creates a second source dopant pocket without creating an additional drain dopant pocket, thus creating the asymmetric doping profile.

JP 2009 054765 relates to a semiconductor with a channel region having a region of high impurity concentration and a region of low impurity concentration and is formed in terms of self-matching by ion implantation through an implantation mask of two kinds of second conductivity impurities different in diffusion coefficients, extension of the implantation mask, ion implantation of the first conductivity impurity and diffusion of the second conductivity impurity with the large diffusion coefficient owing to activation annealing.

Wilson R G ("The Pearson IV distribution and its Application to Ion Implanted Depth Profiles", Radiation Effects, Gordon and Breach Science Publishers, New York, vol. 46, January 1980, pages 141-147) discusses the Pearson IV distribution system and the applicability of same to ion implantation profiles.

US 2012/097980A1 relates to a termination configuration of a silicon carbide insulating gate type semiconductor device that includes a semiconductor layer of a first conductivity type having a first main face, a gate electrode, and a source interconnection, as well as a circumferential resurf region. The semiconductor layer includes a body region of a second conductivity type, a source region of the first conductivity type, a contact region of the second conductivity type, and a circumferential resurf region of the second conductivity type.

SUMMARY

This section provides a general summary of the disclosure, and is not a comprehensive disclosure of its full scope or all of its features.

The present disclosure relates to a Silicon carbide (SiC) planar transistor device. In particular embodiments, the disclosure describes an optimized retrograde channel implant for Silicon carbide (SiC) planar transistor devices.

Embodiments of the present invention can improve the control of threshold voltage $V_{TH}$ and the channel length $L_{CH}$ with respect to process variation and to pin the peak electric field away from the gate oxide/SiC interface to increase the reliability of the device.

The subject disclosure provides for a Silicon carbide (SiC) planar transistor device comprising a SiC semiconductor substrate of a first charge type having a top surface and a bottom surface, a SiC epitaxial layer of a first charge type formed on the top surface of the SiC semiconductor substrate, the SiC epitaxial layer having a top surface, a source structure of a first charge type formed in the top surface of the SiC epitaxial layer, the source structure having a top surface, a drain structure of a first charge type formed on the bottom surface of the SiC semiconductor substrate, a gate structure comprising a gate oxide and a gate runner, wherein the gate oxide covers at least part of the source structure and the gate runner, a channel region of a second charge type located in vertical direction below the gate structure and adjacent to the source structure, wherein a doping profile of the second charge type of the channel region comprises a first region and a second region, wherein the first region has a constant doping concentration in a range of $2*e^{17}$ cm$^{-3}$ to $3*e^{18}$ cm$^{-3}$ (i.e., $2\times10^{17}$ cm$^{-3}$ to $3\times10^{18}$ cm$^{-3}$) and is located in a vertical direction below to the gate oxide with a depth between 50 nm to 250 nm from the top surface of the SiC epitaxial layer and the second region has a Pearson-Type-IV-like distributed doping concentration with a peak doping concentration in a range of $1.5*e^{18}$ cm$^{-3}$ to $8*e^{18}$ cm$^{-3}$ and is located in a vertical direction below and adjacent to the first region with the peak position of the Pearson-Type-IV-like distribution in a range of 300 nm to 500 nm from the top surface of the SiC epitaxial layer. Pearson Type IV is widely used to fit observed distributions obtained from data or Monte Carlo simulations. The length of the channel ($L_{CH}$) of the transistor is in a range of 50 nm to 250 nm.

The subject disclosure also provides for a Silicon carbide (SiC) planar transistor device, wherein the planar transistor is one of a metal-oxide-semiconductor field-effect transistor (MOSFET) or an insulated-gate bipolar transistor (IGBT).

In accordance with another aspect of the subject disclosure, in a Silicon carbide (SiC) planar transistor device the threshold voltage ($V_{TH}$) is in a range of 2V to 3.5V.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

DETAILED DESCRIPTION OF ILLUSTRATIVE EMBODIMENTS

Figure 1:
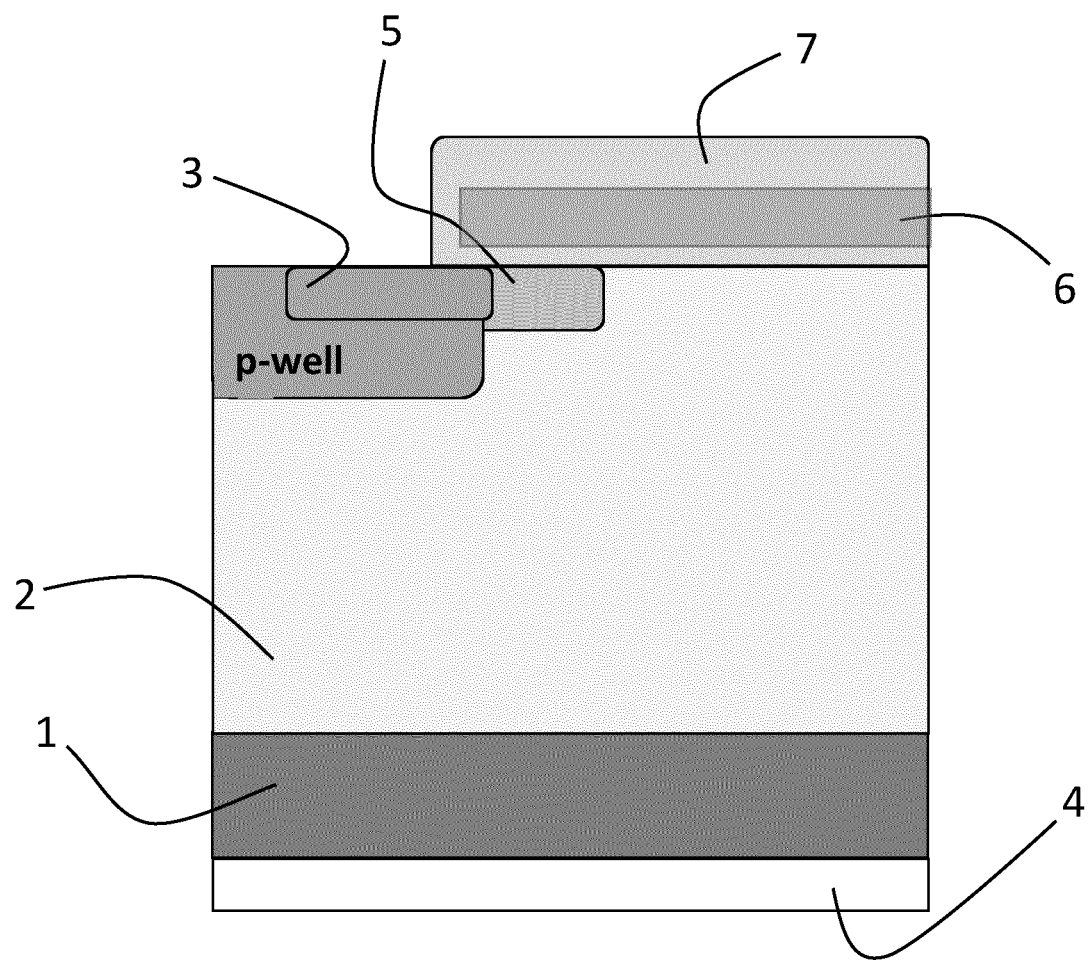
FIG. 1 shows an example of a cross-section of a planar MOSFET structure.

Examples of embodiments will now be described more fully with reference to the accompanying drawings.

Example embodiments are provided so that this disclosure will be thorough, and willfully convey the scope to those who are skilled in the art. Numerous specific details are set forth such as examples of specific components, devices, and methods, to provide a thorough under-standing of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance.

It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

The embodiments refer to MOS-based SiC planar devices such as, e.g., metal-oxide-semiconductor field-effect transistors (MOSFET) or an insulated-gate bipolar transistors (IGBT) as shown in FIG. 1, for example.

In FIG. 1. An example of a cross-section of a typical planar SiC MOSFET structure is shown. The silicon carbide (SiC) planar transistor device in FIG. 1 comprises a SiC semiconductor substrate 1 of a first charge type, e.g., p-type, having a top surface and a bottom surface. A SiC epitaxial layer 2 of the first charge type is formed on the top surface of the SiC semiconductor substrate 1, the SiC epitaxial layer 2 having a top surface. A source structure 3 of the first charge type is formed in the top surface of the SiC epitaxial layer 2, the source structure 3 having a top surface. A drain structure 4 of the first charge type is formed on the bottom surface of the SiC semiconductor substrate 1 and a gate structure 6, 7 comprising a gate oxide 7 and a gate runner 6, wherein the gate oxide 7 covers at least part of the source structure 3 and the gate runner 6. A channel region 5 of a second charge type, e.g., n-type is located in vertical direction below the gate structure 6, 7 and adjacent to the source structure 3.

Figure 2:
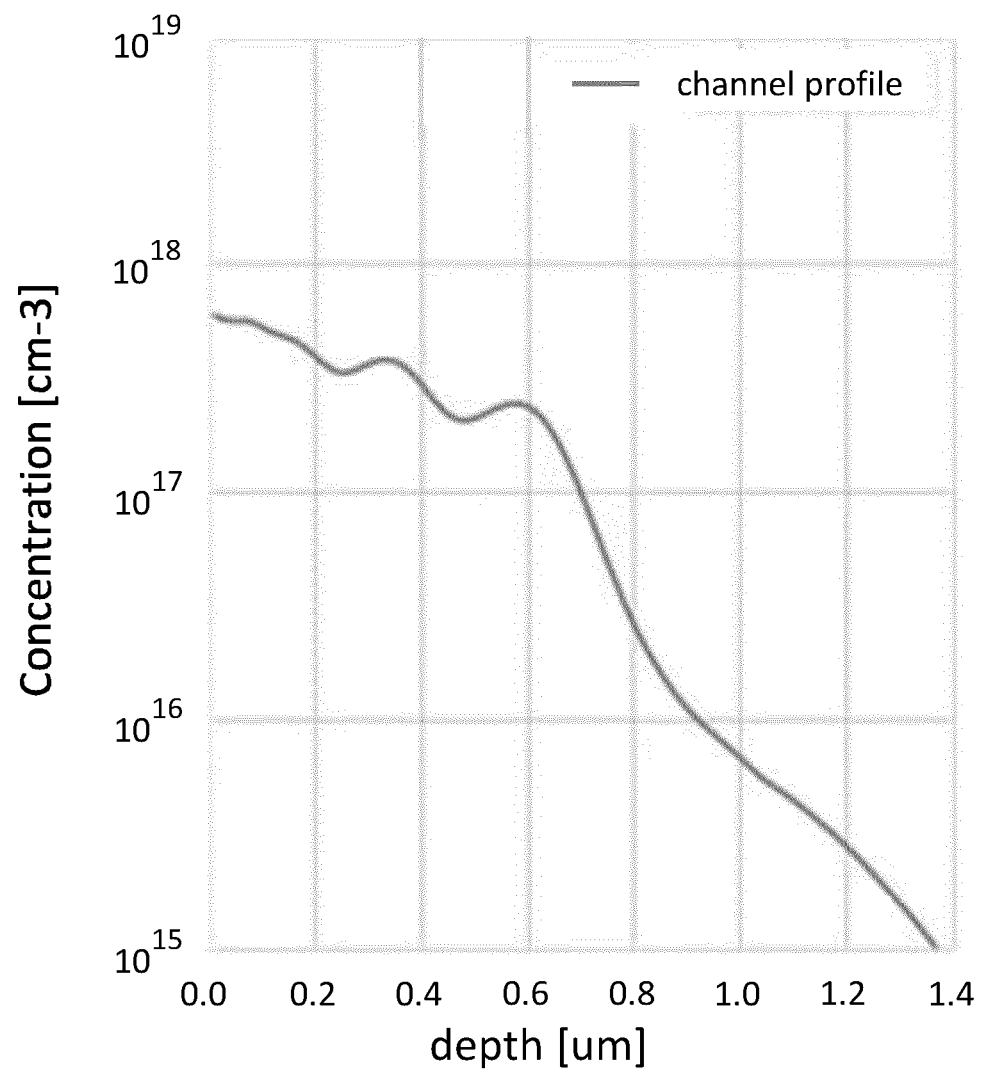
FIG. 2 shows a channel doping profile of a MOSFET structure.

An example of a channel profile used in planar MOSFET devices is shown FIG. 2.

Despite from the fact that the devices with a channel profile shown in FIG. 2 are working, the following deficiencies may arise:

Even when implanted through the nominal oxide thickness, a variation of the doping concentration in the first 200 nm is quite high. $V_{TH}$ may shift significantly depending on how much SiC is removed by the oxidation process. For example, removing 10 nm of SiC causes a reduction of 13% in the surface channel concentration.

The thickness of the screening oxide significantly affects the surface channel concentration and therefore $V_{TH}$. The channel profiles are quite similar if 20 nm of SiC are removed by the growth of a thermal oxide. But in case of a deposited gate oxide, the surface concentration drops significantly and therefore $V_{TH}$ decreases. This could be compensating adjusting the dose in the case of deposited oxides, but then any very small variation in the consumed SiC leads to a great change in surface concentration.

The channel length $L_{CH}$ in planar devices is in theory determined by gate spacers but due to the scattering during implantation, different channel profiles result in different lateral shapes which also may affect the constancy of $L_{CH}$. For example, the channel length of a planar MOSFET device with channel doping increases as more SiC thickness is consumed during gate oxidation.

Figure 3:
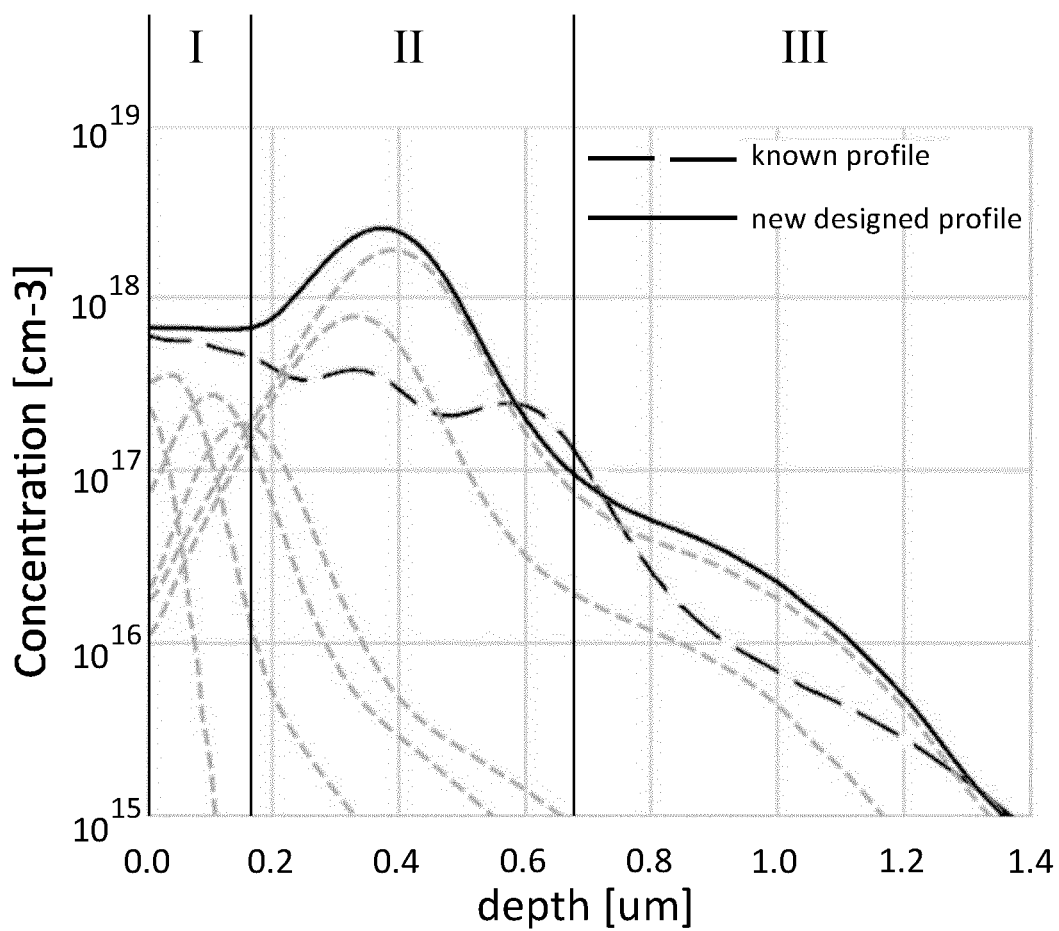
FIG. 3 shows a channel doping profile according to an embodiment of the present invention.

To overcome the above mentioned deficiencies and to provide an improved planar SiC device, a tailored doping profile for the channel region of the planar SiC device in the vertical and horizontal direction has been designed by mathematical optimization. FIG. 3 shows the combination of several implantations (in dashed lines) with doses chosen through a mathematical optimization procedure yielding in the new designed profile (in continuous line). The proposed profile is not only flat in the vertical direction but also in the lateral direction, ensuring that $L_{CH}$ is stable with respect to process variation. It is evident from FIG. 3 that this new designed profile has negligible variation of the dopant concentration in the first 200 nm.

The profile consists in a first flat region (I) of a depth between 50 nm and 250 nm of constant doping between $2e^{17}$ and $3e^{18}$ cm$^{-3}$, depending on the choice of the threshold $V_{TH}$, the oxide capacitance and the interface trap concentration allowing for a maximum variation of 8-10% from the constant value. Examples of dopants are Al, N, B, P.

The peak part of the profile may be obtained with one of more implantations, reaching a peak position in section II in FIG. 3 between 300 nm and 500 nm and a peak concentration between $1.5e^{18}$ cm$^{-3}$ and $8e^{18}$ cm$^{-3}$.

The Silicon carbide (SiC) planar transistor device improved by the above mentioned tailored channel profile, therefore comprises a SiC semiconductor substrate of a first charge type having a top surface and a bottom surface, a SiC epitaxial layer of a first charge type formed on the top surface of the SiC semiconductor substrate, the SiC epitaxial layer having a top surface, a source structure of a first charge type formed in the top surface of the SiC epitaxial layer, the source structure having a top surface, a drain structure of a first charge type formed on the bottom surface of the SiC semiconductor substrate, a gate structure comprising a gate oxide and a gate runner, wherein the gate oxide covers at least part of the source structure and the gate runner, a channel region of a second charge type located in vertical direction below the gate structure and adjacent to the source structure, wherein a doping profile of the second charge type of the channel region comprises a first region and a second region, wherein the first region has a constant doping concentration in a range of $2*e^{17}$ cm$^{-3}$ to $3*e^{18}$ cm$^{-3}$ and is located in a vertical direction below to the gate oxide with a depth between 50 nm to 250 nm from the top surface of the SiC epitaxial layer and the second region has a Pearson-Type-IV-like distributed doping concentration with a peak doping concentration in a range of $1.5*e^{18}$ cm$^{-3}$ to $8*e^{18}$ cm$^{-3}$ and is located in a vertical direction below and adjacent to the first region with the peak position of the Pearson-Type-IV-like distribution in a range of 300 nm to 500 nm from the top surface of the SiC epitaxial layer. In one embodiment, the flat first region is located in a vertical direction below to the gate oxide with a depth between 75 nm to 150 nm. In another embodiment, the oxide capacitance and the interface trap concentration allowing for a maximum variation of 2%-5% from the constant value.

The improved channel profile insures that a constant $L_{CH}$ is maintained irrespective of process variations. Furthermore the optimized channel profile for a planar SiC device enables an accurate and robust control of threshold voltage $V_{TH}$ and channel length $L_{CH}$ with respect to process variation (i.e., variation and non-uniformity of thickness of the implantation screening oxide or variation in the consumed SiC thickness during gate formation depending on, e.g., the oxidation conditions etc.) and pinning of the peak electric field away from the gate oxide/SiC interface to increase the reliability of the device.

Moreover, the improved channel profile ensures that these values of $V_{TH}$ and $L_{CH}$ are maintained irrespective of the variability of processing (screening oxide thickness and consumed SiC thickness are not uniform over the wafer surface). In this respect, constant values of $V_{TH}$ and $L_{CH}$ achieve a smaller variation in the device characteristics and a better yield.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A silicon carbide (SiC) planar transistor device comprising:
   a SiC semiconductor substrate of a first charge type having a top surface and a bottom surface;
   a SiC epitaxial layer of the first charge type formed on the top surface of the SiC semiconductor substrate, the SiC epitaxial layer having a top surface;
   a source structure of the first charge type formed in the top surface of the SiC epitaxial layer, the source structure having a top surface;
   a drain structure of the first charge type formed on the bottom surface of the SiC semiconductor substrate;
   a gate structure comprising a gate dielectric and a gate runner, wherein the gate dielectric covers at least part of the source structure and the gate runner;
   a channel region of a second charge type located in vertical direction below the gate structure and adjacent to the source structure, wherein a doping profile of the second charge type of the channel region comprises a first region and a second region;
   wherein the first region has a constant doping concentration in a range of $2\times10^{17}$ cm-3 to $3\times10^{18}$ cm$^{-3}$ and is located in a vertical direction below to the gate dielectric with a depth between 50 nm to 250 nm from the top surface of the SiC epitaxial layer;
   wherein the second region has a Pearson-Type-IV-like distributed doping concentration with a peak doping concentration in a range of $1.5\times10^{8}$ cm$^{-3}$ to $8\times10^{18}$ cm$^{-3}$ and is located in a vertical direction below and adjacent to the first region with the peak position of the Pearson-Type-IV-like distribution in a range of 300 nm to 500 nm from the top surface of the SiC epitaxial layer; and
   wherein the channel has a length in a range of 50 nm to 250 nm.

2. The silicon carbide planar transistor device according to claim 1, wherein the planar transistor is a metal-oxide-semiconductor field-effect transistor.

3. The silicon carbide planar transistor device according to claim 2, wherein the transistor device has threshold voltage in a range of 2V to 3.5V.

4. The silicon carbide planar transistor device according to claim 1, wherein the planar transistor is an insulated-gate bipolar transistor.

5. The silicon carbide planar transistor device according to claim 4, wherein the transistor device has threshold voltage in a range of 2V to 3.5V.

6. The silicon carbide planar transistor device according to claim 1, wherein the transistor device has threshold voltage in a range of 2V to 3.5V.

7. The silicon carbide planar transistor device according to claim 1, wherein the gate dielectric comprises a gate oxide.

8. The silicon carbide planar transistor device according to claim 1, wherein an oxide capacitance and interface trap concentration allow for a maximum variation of 2%-5% from a constant value.

9. The silicon carbide planar transistor device according to claim 1, wherein the first region is doped with Al, N, B or P.

10. A silicon carbide (SiC) planar transistor device comprising:
- a SiC semiconductor substrate of a first charge type having a top surface and a bottom surface;
- a SiC epitaxial layer of the first charge type formed on the top surface of the SiC semiconductor substrate, the SiC epitaxial layer having a top surface;
- a source structure of the first charge type formed in the top surface of the SiC epitaxial layer, the source structure having a top surface;
- a drain structure of the first charge type formed on the bottom surface of the SiC semiconductor substrate;
- a gate structure comprising a gate dielectric and a gate runner, wherein the gate dielectric covers at least part of the source structure and the gate runner;
- a channel region of a second charge type located in vertical direction below the gate structure and adjacent to the source structure, wherein a doping profile of the second charge type of the channel region comprises a first region and a second region;
- wherein the first region has a constant concentration of dopants in a range of $2\times10^{17}$ cm$^{-3}$ to $3\times10^{18}$ cm$^{-3}$ and is located in a vertical direction below to the gate dielectric with a depth between 50 nm to 250 nm from the top surface of the SiC epitaxial layer, the dopants comprising Al, N, B or P;
- wherein the second region has a Pearson-Type-IV-like distributed doping concentration with a peak doping concentration in a range of $1.5\times10^{18}$ cm$^{-3}$ to $8\times10^{18}$ cm$^{-3}$ and is located in a vertical direction below and adjacent to the first region with the peak position of the Pearson-Type-IV-like distribution in a range of 300 nm to 500 nm from the top surface of the SiC epitaxial layer;
- wherein the channel has a length in a range of 50 nm to 250 nm; and
- wherein the transistor device has threshold voltage in a range of 2V to 3.5V.

11. The silicon carbide planar transistor device according to claim 10, wherein the planar transistor is a metal-oxide-semiconductor field-effect transistor.

12. The silicon carbide planar transistor device according to claim 10, wherein the planar transistor is an insulated-gate bipolar transistor.

13. The silicon carbide planar transistor device according to claim 1, wherein the gate dielectric comprises a gate oxide.

* * * * *